United States Patent
Nishi et al.

(10) Patent No.: US 9,118,321 B2
(45) Date of Patent: Aug. 25, 2015

(54) DIFFERENTIAL OUTPUT BUFFER HAVING MIXING AND OUTPUT STAGES

(75) Inventors: Yoshinori Nishi, San Jose, CA (US); Purushotham Brahmavar Ramakrishna, Bangalore (IN); Srinivas Rao Madala, Prakasam (IN)

(73) Assignee: MegaChips Corporation, Osaka-shi (JP)

( * ) Notice: Subject to any disclaimer, the term of this patent is extended or adjusted under 35 U.S.C. 154(b) by 162 days.

(21) Appl. No.: 13/428,534

(22) Filed: Mar. 23, 2012

(65) Prior Publication Data
US 2012/0249188 A1  Oct. 4, 2012

(30) Foreign Application Priority Data
Mar. 24, 2011  (JP) ................................. 2011-065733

(51) Int. Cl.
*H03B 1/00* (2006.01)
*H03K 19/0185* (2006.01)

(52) U.S. Cl.
CPC .............................. *H03K 19/018528* (2013.01)

(58) Field of Classification Search
CPC .................. G11C 8/08; H04L 25/0272; H04L 2924/00–2924/00014
See application file for complete search history.

(56) References Cited

U.S. PATENT DOCUMENTS

| | | | | |
|---|---|---|---|---|
| 5,587,679 A | * | 12/1996 | Imamura | 327/170 |
| 8,183,885 B2 | * | 5/2012 | Aziz et al. | 326/86 |
| 2008/0218222 A1 | * | 9/2008 | Nishi | 327/108 |
| 2012/0139767 A1 | * | 6/2012 | Larsen et al. | 341/122 |

* cited by examiner

*Primary Examiner* — Sibin Chen
(74) *Attorney, Agent, or Firm* — Oblon, McClelland, Maier & Neustadt, L.L.P.

(57) ABSTRACT

An exemplary differential output buffer includes a mixing stage and an output stage. The mixing stage includes a mixing circuit that mixes a differential data signal and an inverted delayed differential data signal to generate a mixed differential data signal. The output stage includes a first and a second output stage differential pair of transistors. Sources of the transistors in each of the output stage differential pairs are commonly coupled. Gates of the transistors in the first and second output stage differential pairs are supplied with the differential data signal and the mixed differential data signal, respectively. Drains of corresponding ones of the transistors in the first and second output stage differential pairs are commonly connected to form output nodes to output an emphasized differential data signal. The mixing stage includes a mixing ratio setting circuit that sets the mixing ratio to one of 1:0, 1:1, and 0:1.

7 Claims, 6 Drawing Sheets

DIFFERENTIAL OUTPUT BUFFER HAVING MIXING AND OUTPUT STAGES

This application claims benefit of Japanese Application No. JP-A-2011-65733. The disclosure of the prior application is hereby incorporated by reference in its entirety.

BACKGROUND

This disclosure relates to differential output buffers that output emphasized differential output signal in which transitions in the differential data signal are emphasized.

Communication systems that transmit and receive differential data signals are widely used. A pre-emphasis technique is used in transmitting and receiving differential data signals in order to compensate attenuations of high-frequency signals during the transmission in wirings or the like. The pre-emphasis is a technique to emphasize the amplitude of signals at rising and falling edges at the transmitting side in order to compensate attenuation of high-frequency signals at the receiving side.

In the pre-emphasis technique, it is required to variably adjust the emphasis amount at the rising and falling edges depending on the characteristics of the transmission paths. It is also required to emphasize the signal in multiple steps in time with varying levels. For example, the emphasis amount may be maximized immediately after the rising and falling edges, slightly decreased thereafter, and then further decreased. For example, 10G-K specification for transmitting up to 1 meter length on printed circuit boards, which is one of IEEE 802.3 communication specifications, requires the emphasis in up to three steps.

US Patent Application No. 2008-0218222 (Patent document 1) proposes a technique to vary the emphasis level in multiple steps and to continue the emphasis in multiple steps in time with varying levels. Patent document 1 discloses a differential output buffer including a pre-driver stage and an output driver stage. The pre-driver stage includes a first differential pair that performs a current subtraction. The output driver stage includes a second differential pair and receives a second differential data signal from the pre-driver stage and outputs an output signal to a transmission line.

The pre-driver stage can generate signals that accurately represent the emphasis levels. The output driver stage receives differential signals generated by the pre-driver stage at the gates of transistors of the second differential pair. However, the output driver stage cannot always generate accurately emphasized output signals. That is, the output driver stage has a relatively high gain when the amplitude of the differential signal input to the gates of the transistors in the second differential pair is small. When the amplitude of the input differential signal increases, however, the output driver stage saturates and its gain decreases. As a result, the amplitude of the output signal cannot be accurately controlled by the amplitude of the signal input from the pre-driver stage. Accordingly, it is impossible to realize emphasis levels represented by the signals generated by the pre-driver stage.

As explained above, the emphasis technique requires a function to control the emphasis amounts in multiple levels and also requires an accurate control of the emphasis levels.

SUMMARY

It would be advantageous to provide differential output drivers that can accurately control the emphasis amounts in multiple steps without increasing output capacitance and chip area.

Aspects of this disclosure provide a differential output buffer that includes a mixing stage and an output stage. The mixing stage includes a mixing circuit that mixes a differential data signal and an inverted delayed differential data signal, which is the differential data signal delayed by a delay period and inverted, to generate a mixed differential data signal. The output stage includes a first and a second output stage current source and a first and a second output stage differential pair of transistors. Sources of the transistors in each of the output stage differential pairs are commonly coupled and supplied with an output stage operating current from corresponding one of the output stage current sources. Gates of the transistors in the first output stage differential pair are supplied with the differential data signal and gates of the transistors in the second output stage differential pair are supplied with the mixed differential data signal. Drains of corresponding ones of the transistors in the first and second output stage differential pairs are commonly connected to form output nodes from which an emphasized differential data signal is output. Further, the mixing stage includes a mixing ratio setting circuit that sets a mixing ratio between the differential data signal and the inverted delayed differential data signal to one of 1:0, 1:1, and 0:1.

In an example, the mixing circuit may include a first and a second mixing stage current source and a first and a second mixing stage differential pair of transistors. Sources of the transistors in each of the mixing stage differential pairs may be commonly coupled and supplied with a mixing stage operating current from corresponding one of the mixing stage current sources. Gates of the transistors in the first mixing stage differential pair may be supplied with the differential data signal and gates of the transistors in the second mixing stage differential pair may be supplied with the inverted delayed differential data signal. Drains of corresponding ones of the transistors in the first and second mixing stage differential pairs may be commonly connected to respective mixing stage load resistors to form mixing stage output nodes from which the mixed differential data signal is output. Further, the mixing ratio setting circuit may set the mixing ratio by one of (1) enabling or disabling to supply the mixing stage operating current to each of the first and second mixing stage differential pairs; and (2) enabling or disabling to supply one of the differential data signal and the inverted delayed differential data signal to the gates of the transistors in each of the first and second mixing stage differential pairs.

Further, each of the first and second mixing stage current sources may supply a first mixing stage operating current and a second mixing stage operating current, which is twice the first mixing stage operating current, and the mixing ratio setting circuit may set the mixing ratio to (1) 1:1 by enabling each of the first and second mixing stage current sources to supply the first mixing stage operating current to corresponding one of the first and second mixing stage differential pairs; and (2) one of 1:0 and 0:1 by enabling one of, and disabling the other of, the first and second mixing stage current sources to supply the second mixing stage operating current to corresponding one of the first and second mixing stage differential pairs.

In an embodiment, the mixing circuit includes a first mixing circuit that generates a first mixed differential data signal by mixing the differential data signal and the inverted delayed differential data signal with a first mixing ratio and a second mixing circuit that generates a second mixed differential data signal by mixing the differential data signal and the inverted delayed differential data signal with a second mixing ratio. The second output stage current source may include a first and a second emphasizing current source, and the second output stage differential pair may include a first and a second emphasizing differential pair of transistors. Sources of the transistors in each of the emphasizing differential pairs may be commonly coupled and supplied with an emphasizing current from corresponding one of the emphasizing current sources, the emphasizing currents supplied from the first and second emphasizing current sources are different with each other. Gates of the transistors in the first emphasizing differential pair may be supplied with the first mixed differential data signal and gates of the transistors in the second emphasizing differential pair may be supplied with the second mixed differential data signal. Further, the mixing ratio setting circuit may set the mixing ratio of each of the first and second mixing ratios to one of 1:0, 1:1, and 0:1.

In another embodiment, the inverted delayed differential data signal may include an inverted first-tap delayed differential data signal, which is the differential data signal delayed by a first delay period and inverted, and an inverted second-tap delayed differential signal, which is the differential data signal delayed by a second delay period, different from the first delay period, and inverted. The mixing circuit may include a first mixing circuit that generates a first mixed differential data signal by mixing the differential data signal and the inverted first-tap delayed differential data signal with a first mixing ratio, and a second mixing circuit that generates a second mixed differential data signal by mixing the differential data signal and the inverted second-tap delayed differential data signal with a second mixing ratio. The second output stage current source may include a first and a second emphasizing current source, and the second output stage differential pair may include a first and a second emphasizing differential pair of transistors. Sources of the transistors in each of the emphasizing differential pairs may be commonly coupled and supplied with an emphasizing current from corresponding one of the emphasizing current sources. Gates of the transistors in the first emphasizing differential pair may be supplied with the first mixed differential data signal and gates of the transistors in the second emphasizing differential pair may be supplied with the second mixed differential data signal. Further, the mixing ratio setting circuit may set each of the first and second mixing ratios to one of 1:0, 1:1, and 0:1.

In an example, the inverted delayed differential data signal may include an inverted first-tap delayed differential data signal, which is the differential data signal delayed by a first delay period and inverted, and an inverted second-tap delayed differential signal, which is the differential data signal delayed by a second delay period, different from the first delay period, and inverted. The mixing circuit may generate the mixed differential data signal by mixing the differential data signal, the inverted first-tap delayed differential data signal, and the inverted second-tap delayed differential data signal. Further, the mixing ratio setting circuit may set a mixing ratio between the differential data signal, the inverted first-tap delayed differential data signal, and the inverted second-tap delayed differential data signal to one of 1:0:0, 1:1:0, 1:0:1, 0:1:0, 0:0:1, and 0:1:1.

Another aspect of this disclosure provides a method of controlling an emphasis level of an emphasized differential data signal. The method includes providing an output stage including a first and a second output stage current source and a first and a second output stage differential pair of transistors. Sources of the transistors in each of the output stage differential pairs are commonly coupled and supplied with an output stage operating current from corresponding one of the output stage current sources, and drains of corresponding ones of the transistors in the first and second output stage differential pairs are commonly connected to form output nodes. The method further includes mixing a differential data signal and an inverted delayed differential data signal with a mixing ratio to generate a mixed differential data signal, inputting the differential data signal to gates of the transistors in the first output stage differential pair and the mixed differential data signal to gates of the transistors in the second output stage differential pair, and outputting the emphasized differential data signal from the output nodes. Furthermore, the method includes controlling the emphasis level of the emphasized differential data signal by setting the mixing ratio to one of 1:0, 1:1, and 0:1.

Still another aspect of this disclosure provides a method of designing a differential output buffer that includes designing a mixing stage and an output stage. The mixing stage includes a mixing circuit that mixes a differential data signal and an inverted delayed differential data signal with a mixing ratio to generate a mixed differential data signal. The output stage includes a first and a second output stage current source and a first and a second output stage differential pair of transistors. Sources of the transistors in each of the output stage differential pairs are commonly coupled and supplied with an output stage operating current from corresponding one of the output stage current sources, gates of the transistors in the first output stage differential pair are supplied with the differential data signal and gates of the transistors in the second output stage differential pair are supplied with the mixed differential data signal, and drains of corresponding ones of the transistors in the first and second output stage differential pairs are commonly connected to form output nodes from which an emphasized differential data signal is output. The designing of the output stage includes determining dimensions of the transistors in the first and second output stage differential pairs such that (1) a sum of the dimensions of the transistors in the first and second output stage differential pairs is capable of transmitting the emphasized differential data signal through a transmission line, and (2) a combination of the dimensions of the transistors in the first and second output stage differential pairs enables to realize required emphasis levels of the emphasized differential data signal by setting the mixing ratio to 1:0, 1:1, and 0:1.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
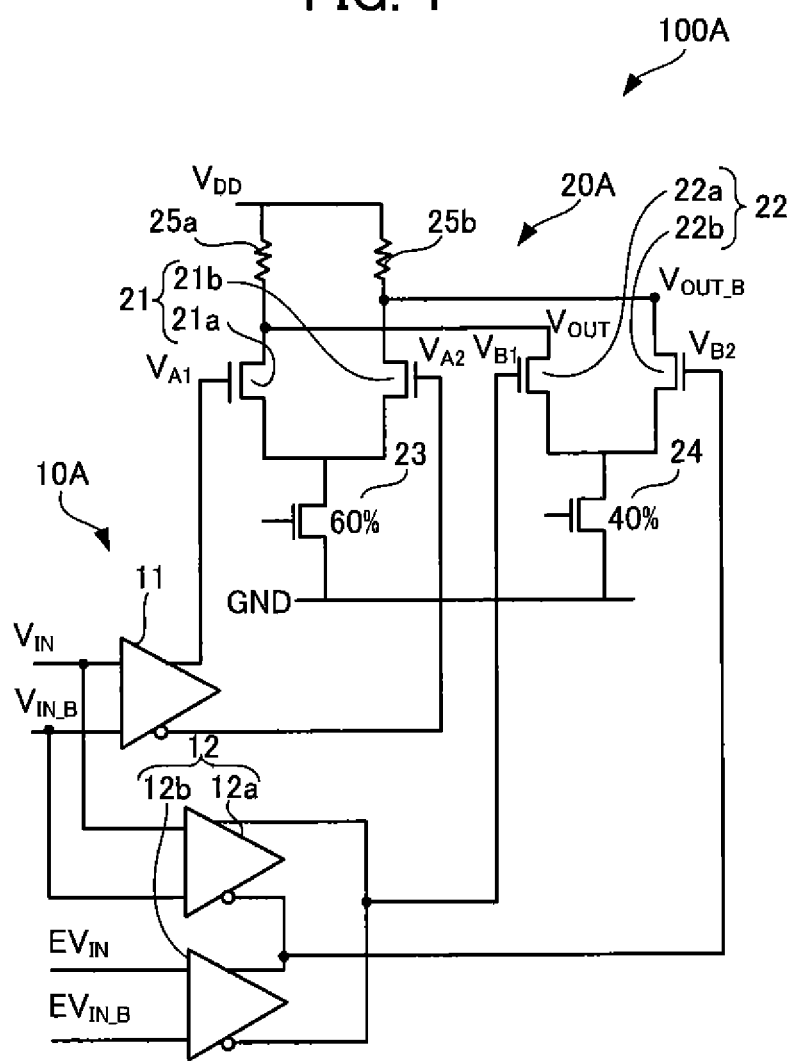
FIG. 1 shows a circuit diagram of a first exemplary differential output buffer.

FIG. 1 is a circuit diagram of a first exemplary differential output buffer according to this disclosure. The exemplary differential output buffer 100A shown in FIG. 1 outputs emphasized differential signal $V_{OUT}$ and $V_{OUT\_B}$ in which transitions in the differential data signal $V_{IN}$ and $V_{IN\_B}$ are emphasized.

The differential output buffer 100A includes a mixing stage 10A and an output stage 20A. The mixing stage 10A generates mixed differential data signal by mixing differential data signal $V_{IN}$ and $V_{IN\_B}$ and inverted delayed differential data signal $EV_{IN}$ and $EV_{IN\_B}$. The inverted delayed differential data signal $EV_{IN}$ and $EV_{IN\_B}$ is the differential data signal $V_{IN}$ and $V_{IN\_B}$ that is delayed by one tap and inverted. Here, "tap" is a unit of delay period. The differential data signal $V_{IN}$ and $V_{IN\_B}$ may be delayed by using, for example, flip-flops that hold and output the signal in synchronous with a clock signal.

The mixing stage 10A includes a first buffer 11 and a mixing circuit 12. The buffer 11 receives the differential data signal $V_{IN}$ and $V_{IN\_B}$ and output differential data signal $V_{A1}$ and $V_{A2}$, which has the same logic as the differential data signal $V_{IN}$ and $V_{IN\_B}$. The buffer 11 may be omitted but preferably be provided to adjust the timing of the differential data signal $V_{A1}$ and $V_{A2}$ with the timing of the mixed differential data signal $V_{B1}$ and $V_{B2}$, which is output from the mixing circuit 12.

The mixing circuit 12 further includes a second buffer 12a and a third buffer 12b. The second buffer 12a receives the differential data signals $V_{IN}$ and $V_{IN\_B}$ and the third buffer 12b receives delayed differential data signals $EV_{IN}$ and $EV_{IN\_B}$, which is the differential data signal $V_{IN}$ and $V_{IN\_B}$ delayed by one tap. As shown in FIG. 1, the inverting output terminal, which is marked by a circuit, of the third buffer 12b and the non-inverting output terminal, which is not marked by a circle, of the second buffer 12a are coupled to form a first output terminal that outputs the output signal $V_{B1}$. While, the inverting output terminal, which is marked by a circuit, of the second buffer 12a and the non-inverting output terminal, which is not marked by a circle, of the third buffer 12b are coupled to form a second output terminal that outputs the output signal $V_{B2}$.

Accordingly, the mixing circuit 12 mixes the differential data signal $V_{IN}$ and $V_{IN\_B}$ and inverted signal of the delayed differential data signal $EV_{IN}$ and $EV_{IN\_B}$ by inputting the differential data signal $V_{IN}$ and $V_{IN\_B}$ to the second buffer 12a and the delayed differential data signal $EV_{IN}$ and $EV_{IN\_B}$ to the third buffer 12b. That is, the mixing circuit 12 mixes the differential data signal $V_{IN}$ and $V_{IN\_B}$ and inverted delayed differential data signal $EV_{IN\_B}$ and $EV_{IN}$ to generate the mixed differential data signal $V_{B1}$ and $V_{B2}$. Here, using differential buffers 12a and 12b having output terminals coupled with each other as described above and selecting appropriate input terminals of these differential buffers to input the differential data signal $V_{IN}$ and $V_{IN\_B}$ and delayed differential data signal $EV_{IN}$ and $EV_{IN\_B}$ enable to mix the differential data signal $V_{IN}$ and $V_{IN\_B}$ and inverted delayed differential data signal $EV_{IN\_B}$ and $EV_{IN}$ without using an inverting circuit.

Specifically, the mixing circuit 12 mixes the differential data signal $V_{IN}$ and $V_{IN\_B}$ and the inverted delayed differential data signal $EV_{IN\_B}$ and $EV_{IN\_B}$, which is an inverted signal of the delayed differential data signal $EV_{IN}$ and $EV_{IN\_B}$, with mixing ratios of 1:0, 1:1, and 0:1 and generates the mixed differential data signal $V_{B1}$ and $V_{B2}$ with respective mixing ratios. The mixing ratio is set by a mixing ratio setting circuit, which is not shown in FIG. 1.

The output stage 20A has a first output differential pair 21 including a first transistor 21a and a second transistor 21b and a second output differential pair 22 including a third transistor 22a and a fourth transistor 22b.

Sources of the first and the second transistors 21a and 21b are commonly connected to the drain of a transistor 23. The source of the transistor 23, which operates as a constant current source, is connected to the ground. The first and the second transistors 21a and 21b have mutually the same dimension. Similarly, sources of the third and the fourth transistors 22a and 22b are commonly connected to the drain of a transistor 24. The source of the transistor 24, which operates as a constant current source, is connected to the ground. The third and the fourth transistors 22a and 22b have mutually the same dimension.

The drain of the first transistor 21a in the first output differential pair 21, which receives the differential data signal $V_{A1}$ to the gate, and the drain of the third transistor 22a in the second output differential transistor pair 22, which receives the mixed differential data signal $V_{B1}$ at the gate, are commonly connected to form a first output node. The first output node is connected to a terminal of a first output stage load resistor 25a, and the other terminal of the first output stage load resistor 25a is connected to the power supply $V_{DC}$. Similarly, the drain of the second transistor 21b in the first output differential transistor pair 21, which receives the differential data signal $V_{A2}$ to the gate, and the drain of the fourth transistor 22b in the second output differential transistor pair 22, which receives the mixed differential data signal $V_{B2}$ at the gate, are commonly connected to form a second output node. The second output node is connected to a terminal of a second output stage load resistor 25b, and the other terminal of the second output stage load resistor 25b is connected to the power supply $V_{DD}$.

Accordingly, the output stage 20A generates an output signal $V_{OUT}$ and $V_{OUT\_B}$ by summing the differential data signal $V_{A1}$ and $V_{A2}$ and the mixed differential data signal $V_{B1}$ and $V_{B2}$, and further by inverting the result of summation. The output stage 20A outputs the differential output signal $V_{OUT}$ and $V_{OUT\_B}$ between the output node, i.e., between the drains of the first and the third transistors 21a and 22a commonly connected to the first output stage load resistor 25a and the drains of the second and the fourth transistors 21b and 22b commonly connected to the second output stage load resistor 25b.

Thus, the entire differential output buffer 100A generates the differential output signal $V_{OUT}$ and $V_{OUT\_B}$ by mixing the differential data signal $V_{IN}$ and $V_{IN\_B}$ and the inverted delayed differential data signal $EV_{IN\_B}$ and $EV_{IN}$.

If no pre-emphasis function is required, a differential output buffer may be constructed without the mixing circuit 12 and the second output stage differential pair 22. That is, a differential output buffer may be constructed only with the buffer 11, the first output stage differential pair 21 and the transistor 23 that constitutes the constant current source. Assume that a relative dimension of each of transistors 21a, 21b and 23 of such imaginary differential output buffer, which has a capability of transmitting signals through a transmission line, is 100%. Then, the exemplary differential output buffer 100A shown in FIG. 1 has the same capability of transmitting signals through the transmission line if a sum of the relative dimensions of the transistors in the first and second output stage differential pairs 21 and 22 is 100%.

For example, relative dimensions of the first and second transistors 21a and 21b in the first output stage differential pair 21 and the third and fourth transistors 22a and 22b in the second output stage differential pair 22 in the exemplary differential output buffer 100A may be 60% and 40%, respectively. The transistors 23 and 24 for the constant current sources may have the same relative dimensions as the relative dimensions of the transistors in the corresponding one of the output stage differential pair. Accordingly, a sum of the relative dimensions of the transistors for the constant current sources may also be 100%.

Accordingly, the total area of the output stage 20A of the exemplary differential output buffer 100A shown in FIG. 1 may be made approximately the same as the area of the imaginary differential output buffer. It should be noted that the exemplary differential output buffer 100A has the pre-emphasis function while the imaginary differential output buffer does not have the function. In other words, the exemplary differential output buffer 100A provides the pre-emphasis function without significantly increasing the area.

Furthermore, an output load capacitance of the exemplary differential output buffer 100A, which is determined by the total dimension of the transistors in the output stage differential pairs, may also be made approximately the same as the load capacitance of the imaginary differential output buffer. In other words, the exemplary differential output buffer 100A provides the pre-emphasis function without significantly increasing the output load capacitance.

Note that the relative dimensions of the transistors in the first and second output stage differential pairs are not limited to 60% and 40%, respectively. The relative dimensions may be set to, 70% and 30%, 50% and 50%, and so on, depending on required emphasis levels.

Figure 2:
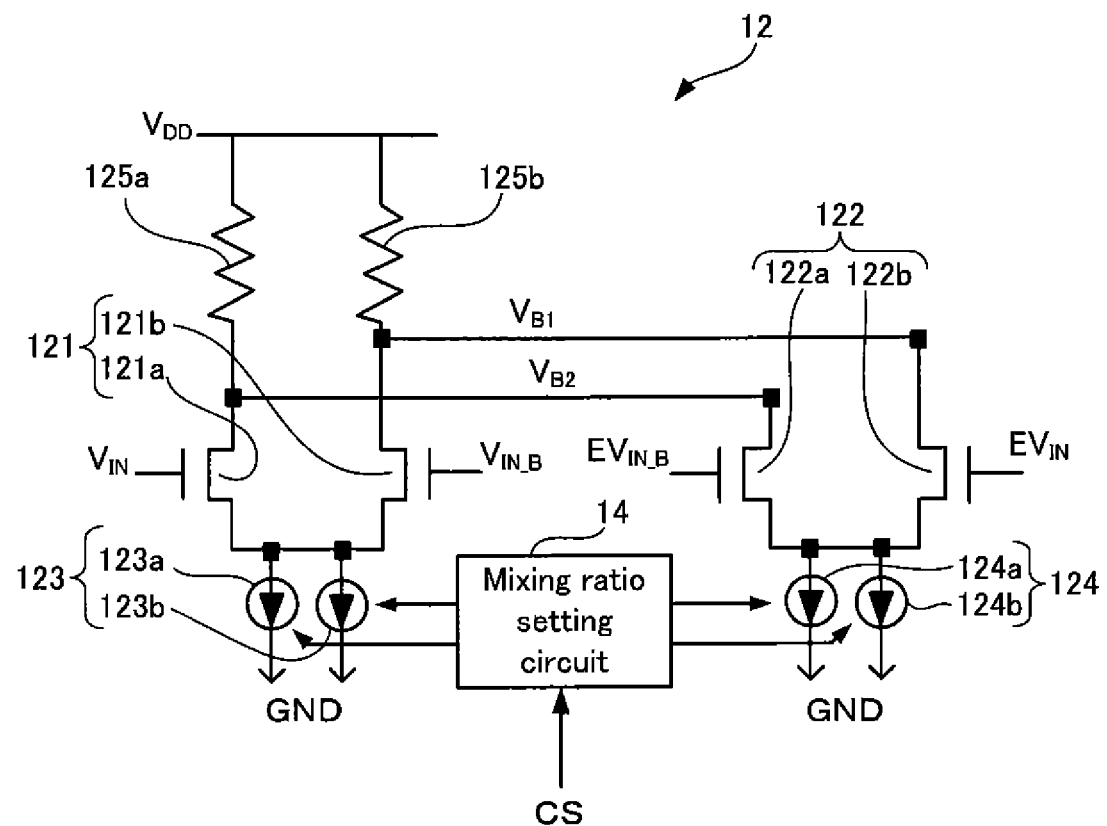
FIG. 2 shows a circuit diagram of an exemplary mixing circuit in the first exemplary differential output buffer shown in FIG. 1.

FIG. 2 is a circuit diagram of an exemplary mixing circuit that constitutes the mixing stage 10A of the first exemplary differential output buffer 100A shown in FIG. 1.

The exemplary mixing circuit 12 has a similar construction as the output stage 20A shown in FIG. 1. That is, the exemplary mixing circuit 12 has a first mixing stage differential pair 121 including first and second transistors 121a and 121b, and a second mixing stage differential pair 122 including third and fourth transistors 122a and 122b. Transistors in each of the differential pairs 121 and 122 have mutually the same dimension. Further, different from the output stage 20A, a dimension of the transistors in the first mixing stage differential pair 121 and a dimension of the transistors in the second mixing stage differential pair are the same.

Sources of the first and second transistors 121a and 121b, which constitute the first mixing stage differential pair 121, are commonly coupled to constant current sources 123a and 123b, which constitute the first mixing stage current source 123. Similar to the constant current sources in the output stage shown in FIG. 1, each of these constant current sources 123a and 123b may be constructed with, for example, a transistor. Similarly, sources of the third and fourth transistors 122a and 122b, which constitute the second mixing stage differential pair 122, are commonly coupled to constant current sources 124a and 124b, which constitute the second mixing stage current source 124. Each of these four constant current sources 123a, 123b, 124a, and 124b supplies the same current.

Drains of the first transistor 121a in the first mixing stage differential pair 121 and the third transistor 122a in the second mixing stage differential pair 122 are commonly connected to one of the terminals of a first mixing stage load resistor 125a. The other terminal of the first mixing stage load resistor 125a is connected to the power supply $V_{DD}$. Similarly, drains of the second transistor 121b in the first mixing stage differential pair 121 and the fourth transistor 122b in the second mixing stage differential pair 122 are commonly connected to one of the terminals of a second mixing stage load resistor 125b. The other terminal of the second mixing stage load resistor 125b is connected to the power supply $V_{DD}$.

The first mixing stage differential pair 121 receives the differential data signal $V_{IN}$ and $V_{IN\_B}$, and the second mixing stage differential pair 122 receives the delayed differential data signal $EV_{IN}$ and $EV_{IN\_B}$. Specifically, gates of the first and second transistors 121a and 121b in the first mixing stage differential pair 121 receive the differential data signal $V_{IN}$ and $V_{IN\_B}$, and gates of the third and fourth transistors 122a and 122b in the second mixing stage differential pair 122 receive the inverted delayed differential data signal $EV_{IN\_B}$ and $EV_{IN}$.

That is, the gate of the first transistor 121a receives the positive phase differential data signal $V_{IN}$ and the gate of the third transistor 122a, whose drain is coupled to the drain of the first transistor 121a, receives the negative phase delayed differential data signal $EV_{IN\_B}$. Further, the gate of the second transistor 121b receives the negative phase differential data signal $V_{IN\_B}$ and the gate of the fourth transistor 122b, whose drain is coupled to the drain of the second transistor 121b, receives the positive phase delayed differential data signal $EV_{IN}$. This construction enable to mix the differential data signal $V_{IN}$ and $V_{IN\_B}$ and the inverted delayed differential data signal $EV_{IN\_B}$ and $EV_{IN}$.

FIG. 2 further shows a mixing ratio setting circuit 14. The mixing ratio setting circuit 14 controls each of four constant current sources 123a, 123b, 124a, and 124b in accordance with the control signal CS. Specifically, the mixing ratio setting circuit 14 enable/disable each of the constant current sources to supply the source current to each of the first mixing stage differential pair 121 including transistors 121a and 121b and the second mixing stage differential pair 122 including transistors 122a and 122b. Here, the mixing ratio setting circuit 14 can only make one of following three modes;

Mode 1: enable both of two constant current sources 123a and 123b that constitute the first mixing stage current source 123 to supply the source currents to the first mixing stage differential pair 121 and disable both of two constant current sources 124a and 124b that constitutes the second mixing stage current source 124 to supply the sources current to the second mixing stage differential pair 122;

Mode 2: enable one of, and disable the other one of, two constant current sources 123a and 123b that constitute the first mixing stage current source 123 to supply the source current to the first mixing stage differential pair 121 and enable one of, and disable the other one of, two constant current sources 124a and 124b that constitutes the second mixing stage current source 124 to supply the source current to the second mixing stage differential pair 122; and Mode 3: disable both of two constant current sources 123a and 123b that constitute the first mixing stage current source 123 to supply the source currents to the first mixing stage differential pair 121 and enable both of two constant current sources 124a and 124b that constitutes the second mixing stage current source 124 to supply the source currents to the second mixing stage differential pair 122.

The mixing stage mixes the differential data signal $V_{IN}$ and $V_{IN\_B}$ and the inverted delayed differential data signal $EV_{IN\_B}$ and $EV_{IN}$ with mixing ratios of 1:0, 1:1, and 0:1 in the modes 1, 2, and 3, respectively, and outputs the mixed differential data signal $V_{B1}$ and $V_{B2}$ with respective mixing ratios.

The mixed differential data signal $V_{B1}$ and $V_{B2}$ are input to gates of the transistors 22a and 22b in the second output stage differential pair 22 of the output stage 20A shown in FIG. 1. Here the mixed differential data signal has the mixing ratio between the differential data signal $V_{IN}$ and $V_{IN\_B}$ and the inverted delayed differential data signal $EV_{IN\_B}$ and $EV_{IN}$ of one of 1:0, 1:1, and 0:1. Accordingly, gates of both transistors 22a and 22b that constitute the second output stage differential pair 22 receive signals with the same level, or gate of one of the transistors receive a signal having a logical level of 1 and gate of the other one of the transistors receives a signal having a logical level of 0. In either case, the state of the second output stage differential pair 22 is determined without being affected by the change of gain of the differential pair.

That is, in the former case, each of the transistors 22a and 22b flows a half of the current that the current source 24 supplies. In the latter case, one of the transistors 22a and 22b flows the entire current that the current source 24 supplies, and the other of the transistors flows no current. Accordingly, in either case, the output stage 20A mixes the differential data signal $VI_{IN}$ and $V_{IN\_B}$ and the inverted delayed differential data signal $EV_{IN\_B}$ and $EV_{IN}$ with intended ratios. As a result, the exemplary differential output buffer 100A can generate differential output signals $V_{OUT}$ and $V_{OUT\_B}$ with intended emphasis levels.

As explained above, the differential output drivers according to the exemplary output buffer can accurately control the amount of emphasis in multiple levels without increasing output capacitance and chip area.

The mixing circuit used in the differential output buffer disclosed in Patent document 1, on the other hand, mixes the differential data signal and the inverted delayed differential data signal with various mixing ratios C2:C3 shown in TABLE 3 thereof. As a result, the intended emphasis level may not be realized due to the change of gain of the output stage.

For example, the mixing ratio of C2:C3=100%:0% shown in the first row of TABLE 3 provides the intended emphasis level of 0%. However, the mixing ratio of C2:C3=60%:40% shown on the third row of TABLE 3 does not provide the intended emphasis level. That is, the amplitude of the mixed differential data signal changes depending on the combination of logical levels of the differential data signal and the inverted delayed differential data signal, and the gain of the second output stage differential pair changed depending on the amplitude of the mixed differential data signal. Specifically, when the logical levels of the differential data signal and the inverted delayed differential data signal are the same and the amplitude of the mixed differential data signal is large, the gain of the second output stage differential pair decreases.

As a result, the intended emphasis level of 16% cannot be realized by mixing the inverted delayed differential data signal with a ratio of C3=40%. The actually realized emphasis level is smaller than the intended level due to the decrease of the gain.

TABLE 1 shows mixing ratios of the differential data signal $V_{IN}$ and $V_{IN\_B}$ and the inverted delayed differential data signal $EV_{IN\_B}$ and $EV_{IN}$ in the output signal, or the emphasized differential signal $V_{OUT}$ and $V_{OUTB}$, that the first exemplary differential output buffer 100A shown in FIGS. 1 and 2 generates in each of the modes. Specifically, TABLE 1 shows percentages of the differential data signal $V_{IN}$ and $V_{IN\_B}$ in the column of "VIN" and percentages of the inverted delayed differential data signal $EV_{IN\_B}$ and $EV_{IN}$ in the column of "EV", respectively. TABLE 1 further shows contributions of the first and second output stage differential pairs 21 and 22, which constitute the output stage 20A shown in FIG. 1, to the percentages. Note that the first output stage differential pair 21 contributes to the percentage of "EV", while the second output stage differential pair 22 contributes to percentages of both of "VIN" and "EV".

TABLE 1

| mode | VIN | | EV | |
|---|---|---|---|---|
| | 1st + 2nd | % | 2nd | % |
| 1 | 60 + 40 | 100 | 0 | 0 |
| 2 | 60 + 20 | 80 | 20 | 20 |
| 3 | 60 + 0 | 60 | 40 | 40 |

The first row of TABLE 1 shows the percentages in the first mode where the mixing ratio at the mixing circuit 12 shown in FIG. 2 is 1:0. In the first mode, the second output stage differential pair 22 only receives a signal originated from the differential data signal $V_{IN}$ and $V_{IN\_B}$. The first and second output stage differential pairs contribute to the output signal, or the emphasized differential signal $V_{OUT}$ and $V_{OUT\_B}$, from the output stage 20A with the percentages of 60% and 40%, respectively. Accordingly, the percentages of "VN" and "EV" in the emphasized differential signal $V_{OUT}$ and $V_{OUT\_B}$ in the first mode are 100% and 0%, respectively.

The second row of TABLE 1 shows the percentages in the second mode where the mixing ratio at the mixing circuit 12 is 1:1. In the second mode, the second output stage differential pair 22 receives signals originated from the differential data signal $V_{IN}$ and $V_{IN\_B}$ and the inverted delayed differential data signal $EV_{IN\_B}$ and $EV_{IN}$ mixed with a ratio of 1:1. Accordingly, contributions of the second output stage differential pair 22 to "VIN" and "EV" in the emphasized differential data signal $V_{OUT}$ and $V_{OUT\_B}$ are 20% and 20%, respectively. While, the first output stage differential pair 21 exclusively contributes to "VIN" with the percentage of 60%. Accordingly, in total, the percentages of "YIN" and "EV" in the emphasized differential signal $V_{OUT}$ and $V_{OUT\_B}$ are 80% and 20%, respectively.

The third row of TABLE 1 shows the percentages in the third mode where the mixing ratio at the mixing circuit 12 is 0:1. In the third mode, the second output stage differential pair 22 only receives a signal originated from the inverted delayed differential data signal $EV_{IN\_B}$ and $EV_{IN}$. Accordingly, contributions of the second output stage differential pair 22 to "VIN" and "EV" in the emphasized differential data signal $V_{OUT}$ and $V_{OUT\_B}$ are 0% and 40%, respectively. Accordingly, in total, the percentages of "VIN" and "EV" in the emphasized differential signal $V_{OUT}$ and $V_{OUT\_B}$ are 60% and 40%, respectively.

In the first exemplary differential output buffer 100A, a total dimension of the transistors in the first and second output stage differential pairs 21 and 22 is capable of transmitting output signals through a transmission line. Further, a combination of dimensions of the transistors in the first and second output stage differential pairs 21 and 22 enables to realize required emphasis levels shown in TABLE 1 by setting the mixing ratio at the mixing circuit 12 to 1:0, 1:1, and 0:1. That is, the first exemplary differential output buffer 100A is designed such that i) a sum of dimensions of the transistors in the first and second output stage differential pairs 21 and 22 is capable of transmitting output signals through a transmission line, and ii) a combination of dimensions of the transistors in the first and second output stage differential pairs 21 and 22 enables to realize required emphasis levels by setting the mixing ratio to 1:0, 1:1, and 0:1.

The design of the exemplary differential output buffer may be performed using a CAD (Computer-aided-design) system to generate a layout data. The layout data is used to generate a mask data, and masks formed using the mask data are used to fabricate a semiconductor integrated circuit that includes the exemplary differential output butter.

In the first exemplary embodiment, dimensions of transistors in the first and second output stage differential pairs 21 and 22, or contributions of the first and second output stage differential pairs 21 and 22 shown in FIG. 1 are set to 60% and 40%, respectively. The contributions may be adjusted in accordance with required emphasis levels.

In the first exemplary embodiment, the mixing circuit 12 shown in FIG. 2 includes two mixing stage differential pairs 121 and 122, four constant current sources 123a, 123b, 124a, and 124b each supplies the same current, and the mixing ratio setting circuit 13. The mixing circuit 12 has a construction that two of four constant current sources are provided for each of the first and second mixing stage differential pairs, and that the mixing ratio setting circuit controls ON and OFF of the constant current sources.

The mixing circuit may have various other constructions. For example, because only two of the four constant current sources in the exemplary mixing circuit are ON in any of the modes, the mixing circuit may be constructed with only two constant current sources. The mixing circuit may have switches to connect (i) both of the two constant current sources to the first mixing stage differential pair 121, (ii) one of the two constant current sources to each of the first and second mixing stage differential pairs 121 and 122, or (iii) both of the two constant current sources to the second mixing stage differential pair 122.

It is also possible to provide one constant current source, which is controlled to be ON and OFF, to each of the first and second mixing stage differential pairs 121 and 122. In this case, when one of the constant current sources is ON and the other is OFF, the current flows in the mixing circuit 12 becomes a half of the current that flows in the mixing circuit when both of the constant current sources are ON. As a result, the common mode voltage of the mixed differential data signal increases and the amplitude of the mixed differential data signal becomes a half of the amplitude compared with the case that both of the constant current sources are ON.

However, it is possible to design the output stage 20A that accept the mixed differential data signal with the reduced amplitude at least when the power supply voltage $V_{DD}$ is relatively high. Specifically, the output stage 20A may be designed such that (i) one of the transistors 22a and 22b in the second output stage differential pair 22 flows the entire current of the current source 24 and the other flows no current, and (ii) the amplitude of the output signal is maintained, even when the amplitude of the mixed differential data signal is reduced.

It is also possible to enable/disable the supply of input signals including the differential data signal VIN and VIN_B and the inverted delayed differential data signal $EV_{IN\_B}$ and $EV_{IN}$ to the first and second mixing stage differential pairs 121 and 122. In this case, the constant current sources provided for each of the first and second mixing stage differential pairs 121 and 122 may be kept ON in all of the modes.

The sprit of the first exemplary embodiment and various modifications thereof may also be applied to the second and following exemplary embodiments.

Figure 3:
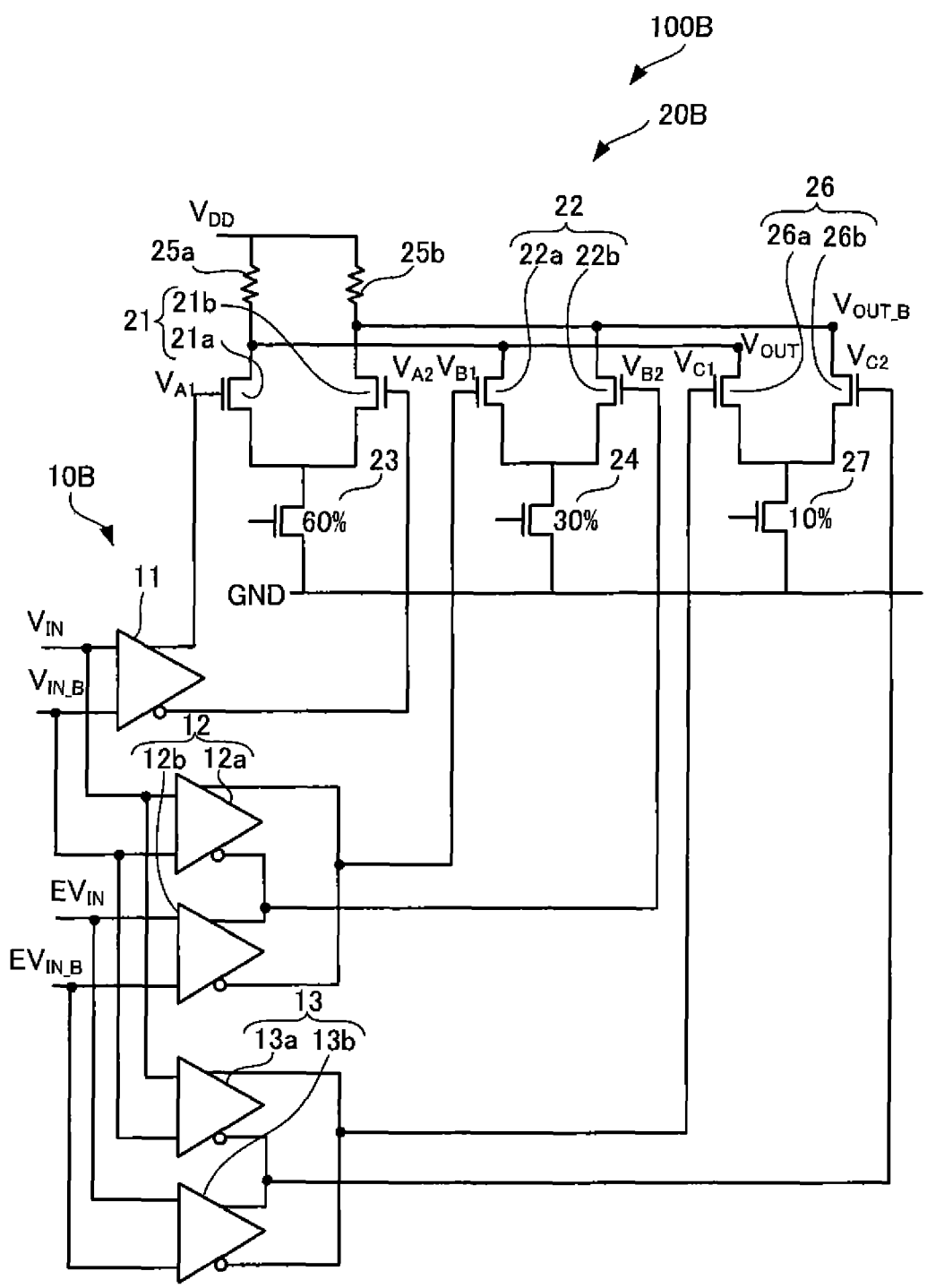
FIG. 3 shows a circuit diagram of a second exemplary differential output buffer.

FIG. 3 is a circuit diagram of a second exemplary differential output buffer according to this disclosure.

The second exemplary differential output buffer 100B shown in FIG. 3 has a mixing stage 10B and an output stage 20B. The mixing stage 10B includes a buffer 11 and a mixing circuit 12, same as the mixing stage 10A of the first exemplary differential output buffer 100A. The mixing stage 10B in the second exemplary differential output buffer further includes another mixing circuit 13. The mixing circuit 13 includes, similar to the mixing circuit 12, two buffers including a fourth buffer 13a and a fifth buffer 13b. The fourth buffer 13a receives the differential data signal $V_{IN}$ and $V_{IN\_B}$, and the fifth buffer 13b receives the delayed differential data signal $EV_{IN}$ and $EV_{IN\_B}$. Same as the mixing circuit 12 shown in FIG. 2, the mixing circuit 13 also mixes the differential data signal $V_{IN}$ and $V_{IN\_B}$ and the inverted delayed differential data signal $EV_{IN\_B}$ and $EV_{IN}$ with a mixing ratio of one of 1:0, 1:1, and 0:1.

The output stage 20B of the second exemplary differential output buffer 100B shown in FIG. 3 includes, similar to the output stage 20A of the first exemplary differential output buffer 100A shown in FIG. 1, a first and a second output stage differential pair 21 and 22. In addition, the output stage 20B of the second exemplary differential output buffer 100B includes a third output stage differential pair 26. Further, the dimension of the third and fourth transistors 22a and 22b that constitute the second output stage differential pair 22b in the second exemplary differential output buffer 100B is different from the dimension of the same transistors in the first exemplary differential buffer 100A shown in FIG. 1.

That is, the third and fourth transistors 22a and 22b in the first exemplary differential output buffer 100A has the relative dimension of 40%. On the other hand, the third and fourth transistors 22a and 22b in the second exemplary differential output buffer 100B has the relative dimension 30%. Accordingly, the transistor 24 also has the relative dimension of 30% and the constant current source formed by the transistor 24 supplies 30% of the total current that flows in the output stage 20B of the second exemplary differential output buffer 100B.

The third output stage differential pair 26 includes a fifth transistor 26a and a sixth transistor 26b. Sources of the fifth and sixth transistors are commonly coupled to the drain of a transistor 27, which is used as a constant current source. The drain of the fifth transistor 26a is commonly coupled with drains of the first and third transistors 21a and 22a. The drain of the sixth transistor 26b is commonly coupled with drains of the second and fourth transistors 21b and 22b.

The fifth and sixth transistors 26a and 26b that constitute the third output stage differential pair 26 have the relative dimension of 10%. The transistor 27 that constitute the constant current source also has the relative dimension of 10% and supplies 10% of the total current of the output stage 20B. That is, in the second exemplary differential output buffer 100B, the total dimension of the transistors in the first, second, and third output stage differential pairs 21, 22, and 23 is 100%.

The output signal, or the second mixed differential data signal, $V_{C1}$ and $V_{C2}$ of the second mixing circuit 13 is supplied to respective gates of the fifth and sixth transistors 26a and 26b that constitute the third output stage differential pair 23. Accordingly, the output stage 20B generates an output signal $V_{OUT}$ and $V_{OUT\_B}$ by summing the differential data signal $V_{A1}$ and $V_{A2}$, the mixed differential data signal $V_{B1}$ and $V_{B2}$, and the second mixed differential data signal $V_{C1}$ and $V_{C2}$ with ratios of 60%, 30%, and 10%, respectively.

TABLE 2 shows mixing ratios of the differential data signal $V_{IN\ and\ VIN\_B}$ and the inverted delayed differential data signal $EV_{IN\_B}$ and $EV_{IN}$ in the output signal, or the emphasized differential signal $V_{OUT}$ and $V_{OUT\_B}$, that the second exemplary differential output buffer 100B shown in FIG. 3 generates. Same as TABLE 1, TABLE 2 shows percentages of the differential data signal $V_{IN}$ and $V_{IN\_B}$ in the column of "VIN" and the inverted delayed differential data signal $EV_{IN\_B}$ and $EV_{IN}$ in the column of "EV", respectively, depending on the mixing ratios in the two mixing circuits 12 and 13. TABLE 2 further shows contributions of the first, second, and third output stage differential pairs 21, 22 and 26, which constitute the output stage 20B, to the percentages.

TABLE 2

| VIN | | EV | |
|---|---|---|---|
| 1st + 2nd + 3rd | % | 2nd + 3rd | % |
| 60 + 30 + 10 | 100 | 0 + 0 | 0 |
| 60 + 30 + 5 | 95 | 0 + 5 | 5 |
| 60 + 30 + 0 | 90 | 0 + 10 | 10 |
| 60 + 15 + 10 | 85 | 15 + 0 | 15 |
| 60 + 15 + 5 | 80 | 15 + 5 | 20 |
| 60 + 15 + 0 | 75 | 15 + 10 | 25 |
| 60 + 0 + 0 | 70 | 30 + 0 | 30 |
| 60 + 0 + 5 | 65 | 30 + 5 | 35 |
| 60 + 0 + 0 | 60 | 30 + 10 | 40 |

As shown in TABLE 2, the second exemplary differential output buffer 100B shown in FIG. 3 can vary the percentage of "EV" from 0% to 40% with a step of 5%. That is, a combination of dimensions of the transistors in the first, second, and third output stage differential pairs 21, 22 and 26 enables to realize required emphasis levels shown in TABLE 2 by setting the mixing ratio in each of the mixing circuits 12 and 13 to 1:0, 1:1, and 0:1. Further, a total dimension of the transistors in the first, second, and third output stage differential pairs 21, 22 and 26 is capable of transmitting output signals through a transmission line.

Accordingly, the second exemplary differential output buffer 100B is designed such that i) a sum of dimensions of the transistors in the first, second, and third output stage differential pairs 21, 22, and 26 is capable of transmitting output signals through a transmission line, and ii) a combination of dimensions of the transistors in the first, second, and third output stage differential pairs 21, 22, and 26 enables to realize required emphasis levels by setting the mixing ratio in each of the mixing circuits 12 and 13 to 1:0, 1:1, and 0:1.

Figure 4:
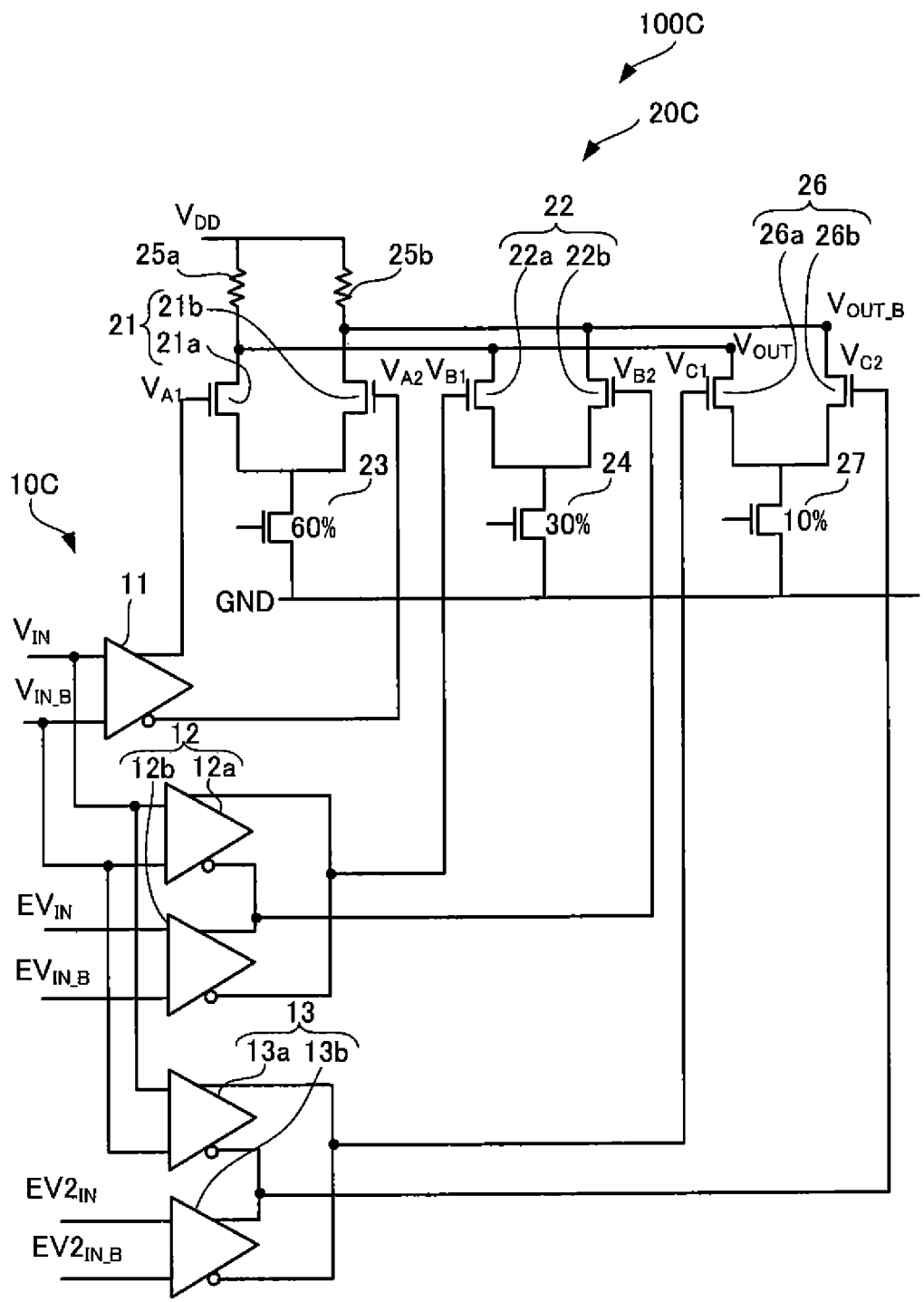
FIG. 4 shows a circuit diagram of a third exemplary differential output buffer.

FIG. 4 is a circuit diagram of a third exemplary differential output buffer according to this disclosure.

The differential output buffer 100C shown in FIG. 4 includes a mixing stage 10C and an output stage 20C. The mixing stage 20C has the same construction as the mixing stage 20B in the second exemplary differential output buffer 100B shown in FIG. 3. However, the sixth buffer 13b that constitute the mixing circuit 13 of the third exemplary differential output buffer 100C receives a different input signal.

That is, the sixth buffer 13b in the mixing stage 10B of the second exemplary differential output buffer 100B shown in FIG. 3 receives the delayed differential data signal $EV_{IN}$ and $EV_{IN\_B}$, while the sixth buffer 13b in the mixing stage 10C of the third exemplary differential output buffer 100C shown in FIG. 4 receives a second delayed differential data signal $EV2_{IN}$ and $EV2_{IN\_B}$. Here, the delayed differential data signal $EV_{IN}$ and $EV_{IN\_B}$ is a signal that delayed the differential data signal $V_{IN}$ and $V_{IN\_B}$ by a delay period of one tap. While the second delayed differential data signal $EV2_{IN}$ and $EV2_{IN\_B}$ is a signal that delayed the differential data signal $V_{IN}$ and $V_{IN\_B}$ by a second delay period of, for example, two taps. Accordingly, the third exemplary differential output buffer 100C shown in FIG. 4 can continue the emphasis during a period of two taps with varying levels.

TABLE 3 shows mixing ratios of the differential data signal $V_{IN}$ and $V_{IN\_B}$, the inverted delayed differential data signal $EV_{IN\_B}$ and $EV_{IN}$, and the inverted second delayed differential data signal $EV2_{IN\_B}$ and $EV2_{IN}$ in the output signal, or the emphasized differential signal $V_{OUT}$ and $V_{OUT}\_B$, that the third exemplary differential output buffer 100C shown in FIG. 4 generates. Same as TABLEs 1 and 2, TABLE 3 shows percentages of the differential data signal $V_{IN}$ and $V_{IN\_B}$ in the column of "VIN" and percentages of inverted delayed differential data signal $EV_{IN\_B}$ and $EV_{IN}$ in the column of "EV", respectively. TABLE 3 additionally shows percentages of the inverted second delayed differential data signal $EV2_{IN\_B}$ and $EV2_{IN}$ in the column of "EV2. TABLE 3 further shows contributions of the first, second, and third output stage differential pairs 21, 22 and 26, which constitute the output stage 20C of the third exemplary differential output buffer 100C, to the percentages.

TABLE 3

| VIN | | EV | | EV2 | |
|---|---|---|---|---|---|
| 1st + 2nd + 3rd | % | 2nd | % | 3rd | % |
| 60 + 30 + 10 | 100 | 0 | 0 | 0 | 0 |
| 60 + 30 + 5 | 95 | 0 | 0 | 5 | 5 |
| 60 + 30 + 0 | 90 | 0 | 0 | 10 | 10 |
| 60 + 15 + 10 | 85 | 15 | 15 | 0 | 0 |
| 60 + 15 + 5 | 80 | 15 | 15 | 5 | 5 |
| 60 + 15 + 0 | 75 | 15 | 15 | 10 | 10 |
| 60 + 0 + 10 | 70 | 30 | 30 | 0 | 0 |
| 60 + 0 + 5 | 65 | 30 | 30 | 5 | 5 |
| 60 + 0 + 0 | 60 | 30 | 30 | 10 | 10 |

As shown in TABLE 3, the third exemplary differential output buffer 100C can continue the emphasis during a delay period of two taps with varying levels. Further, similar to the second exemplary differential output buffer 100b shown in FIG. 3, a combination of dimensions of the transistors in the first, second, and third output stage differential pairs 21, 22 and 26 enables to realize required emphasis levels shown in TABLE 3 by setting the mixing ratio in each of the mixing circuits 12 and 13 to 1:0, 1:1, and 0:1. In addition, similar to the second exemplary differential output buffer 100B shown in FIG. 3, a total dimension of the transistors in the first, second and third output stage differential pairs 21, 22 and 26 is capable of transmitting output signals through a transmission line.

Accordingly, similar to the second exemplary differential output buffer 100B, the third exemplary differential output buffer 100C is designed such that i) a sum of dimensions of the transistors in the first, second, and third output stage differential pairs 21, 22, and 26 is capable of transmitting output signals through a transmission line, and ii) a combination of dimensions of the transistors in the first, second, and third output stage differential pairs 21, 22, and 26 enables to realize required emphasis levels by setting the mixing ratio in each of the mixing circuits 12 and 13 to 1:0, 1:1, and 0:1.

Figure 5:
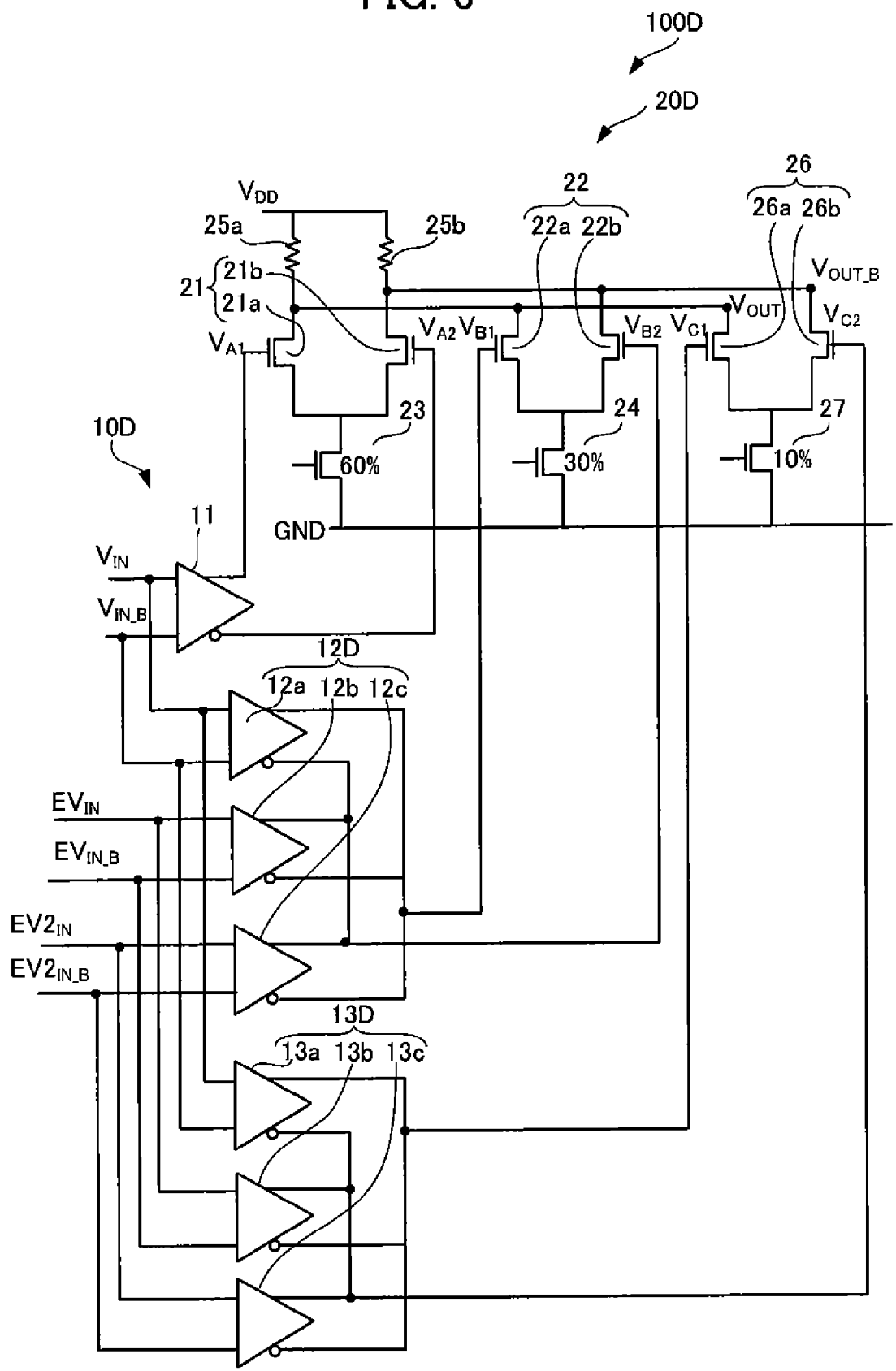
FIG. 5 shows a circuit diagram of a fourth exemplary differential output buffer.

FIG. 5 is a circuit diagram of a fourth exemplary differential output buffer according to this disclosure.

The fourth exemplary differential output buffer 100D shown in FIG. 5 includes a mixing stage 10D and an output stage 20D. The output stage 20D has the same construction as the output stages 20B in the second exemplary differential output buffer 100B shown in FIG. 3 and 20C in the third exemplary differential output buffer 100C shown in FIG. 4. Different from the second and third exemplary differential output buffers 100B and 100C, however, the mixing circuits 12D and 13D of the fourth exemplary differential buffer 100D have respective three buffers 12a, 12b, and 12c, and 13a, 13b, and 13c.

These three buffers 12a, 12b, and 12c, and 13a, 13b, and 13c that constitute each of the mixing circuits 12D and 13D receives the differential data signal $V_{IN}$ and $V_{IN\_B}$, the delayed differential data signal $EV_{IN}$ and $EV_{IN\_B}$, and the second delayed differential data signal $EV2_{IN}$ and $EV2_{IN\_B}$, respectively. The delayed differential data signal $EV_{IN}$ and $EV_{IN\_B}$ and the second delayed differential data signal $EV2_{IN}$ and $EV2_{IN\_B}$ are signals that delayed the differential data signal $V_{IN}$ and $V_{IN\_B}$ by periods of one tap and two taps, respectively.

Figure 6:
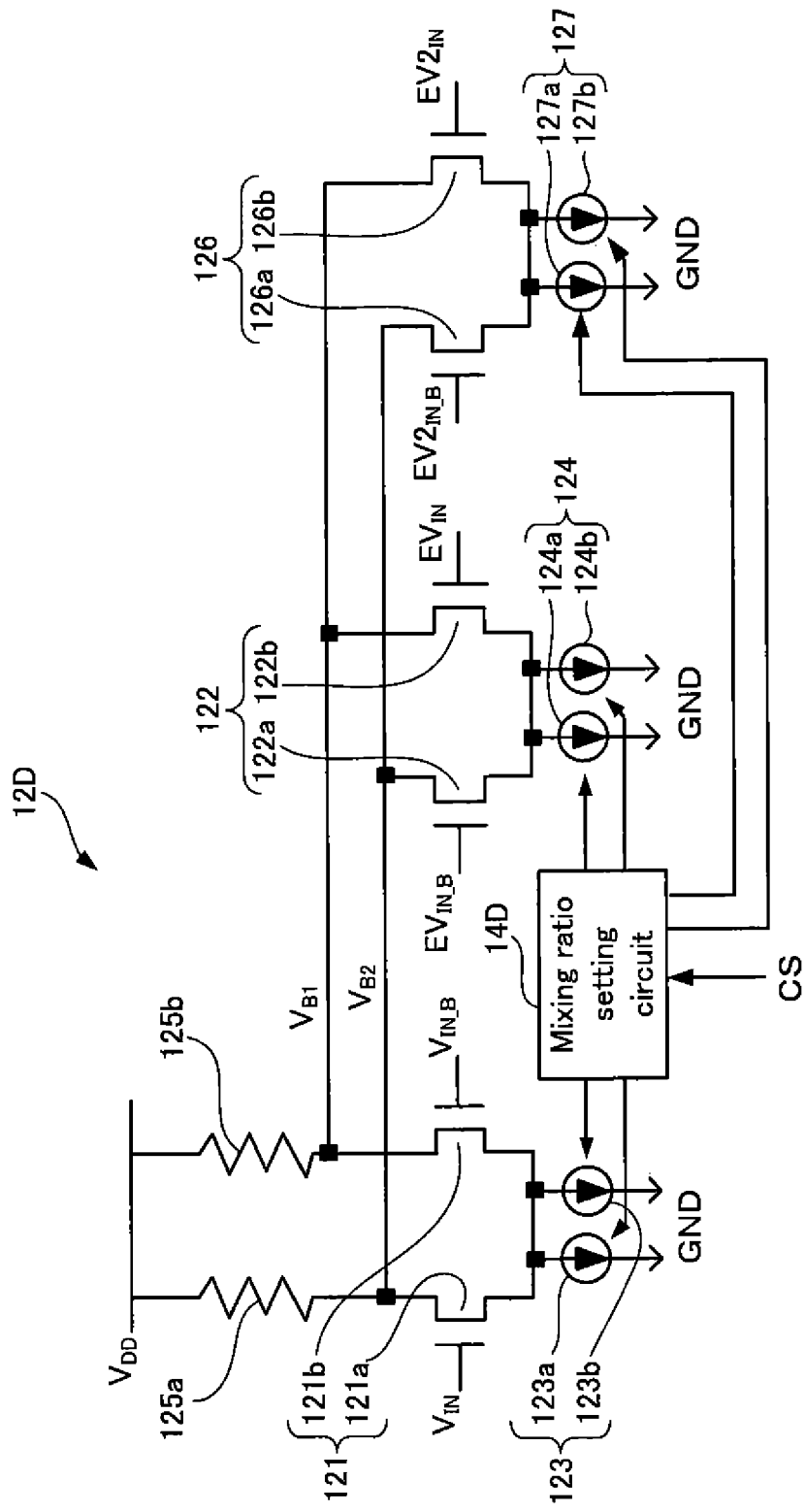
FIG. 6 shows a circuit diagram of a second exemplary mixing circuit in the fourth exemplary differential output buffer shown in FIG. 5.

FIG. 6 is a circuit diagram of an exemplary mixing circuit 12D in the fourth exemplary differential output buffer 100D shown in FIG. 5. The other mixing circuit 13D in the fourth exemplary differential output buffer 100D has the same construction as the mixing circuit 12D.

Similar to the first exemplary mixing circuit 12 shown in FIG. 2, the second exemplary mixing circuit 12D shown in FIG. 6 includes the first and second mixing stage differential pairs 121 and 122. In addition, the second exemplary mixing circuit 12D includes a third mixing stage differential pair 126. Sources of transistors 126a and 126b of the third mixing stage differential pair 126 are commonly coupled to the third mixing stage current source 127.

The third mixing stage current source 127 includes two constant current sources 127a and 127b. Each of these constant current sources 127a and 127b supplies the same current as each of other constant current sources 123a, 123b, 124a, and 124b supplies. The drain of one of the transistors 126a in the third mixing stage differential pair 126 is commonly coupled to drains of the transistors 121a and 122b. The drain of the other one of the transistors 126b in the third mixing stage differential pair 126 is commonly coupled to drains of the transistor 121b and 122b.

The third mixing stage differential pair 126 receives the second delayed differential data signal $EV2_{IN}$ and $EV2_{IN\_B}$. Specifically, gates of the transistor 126a and 126b in the third mixing stage differential pair 126 received inverted second delayed differential data signal $EV2_{IN\_B}$ and $EV2_{IN}$. Accordingly, the second exemplary mixing circuit 12D can mix the differential data signal $V_{IN}$ and $V_{IN\_B}$, the inverted delayed differential data signal $EV_{IN\_B}$ and $EV_{IN}$, and the inverted second delayed differential data signal $EV2_{IN\_B}$ and $EV2_{IN}$.

The second exemplary mixing circuit 12D shown in FIG. 6 includes a second mixing ratio setting circuit 14D that controls, in accordance with the control signal CS, ON and OFF of each of six constant current sources 123a, 123b, 124a, 124b, 127a, and 127b in the first, second, and third mixing stage current sources 123, 124, and 127. Note that, however, the second mixing ratio setting circuit 14D keeps one of these mixing stage current sources OFF and controls the other two of the mixing stage current sources in the same manner as the mixing ratio setting circuit 14 shown in FIG. 2.

For example, the second mixing ratio setting circuit 14D may keep two constant current sources 127a and 127b in the third mixing stage current source 127 OFF and control ON and OFF of the constant current sources 123a, 123b, 124a, and 124b in the first and second mixing stage current sources 123 and 124 in the same manner as the first mixing ratio setting circuit 14 shown in FIG. 2 controls. Thereby, the second mixing ratio setting circuit 14D realizes the first to third modes same as the first mixing ratio setting circuit 14. Further, the second mixing ratio setting circuit 14D may keep two constant current sources 124a and 124b in the second mixing stage current source 124 OFF and control ON and OFF of the constant current sources in the first and third mixing stage current sources 123 and 127 to realize following fourth to sixth modes;

Mode 4: turn ON both of two constant current sources 123a and 123b that constitute the first mixing stage current source 123 and turn OFF both of two constant current sources 127a and 127b that constitutes the third mixing stage current source 127;

Mode 5: turn ON one of, and turn OFF the other one of, two constant current sources 123a and 123b that constitute the first mixing stage current source 123 and turn ON one of, and turn OFF the other one of, two constant current sources 127a and 127b that constitute the third mixing stage current source 127; and Mode 6: turn OFF both of two constant current sources 123a and 123b that constitute the first mixing stage current source 123 and turn ON both of two constant current sources 127a and 127b that constitutes the third mixing stage current source 127.

Furthermore, the second mixing ratio setting circuit 14D may keep two constant current sources 123a and 123b that constitute the first mixing stage current source 123 OFF and control ON and OFF of the constant current sources in the second and third mixing stage current sources 124 and 127 to realize following seventh to ninth modes;

Mode 7: turn ON both of two constant current sources 124a and 124b that constitute the second mixing stage current source 124 and turn OFF both of two constant current sources 127a and 127b that constitutes the third mixing stage current source 127;

Mode 8: turn ON one of, and turn OFF the other one of, two constant current sources 124a and 124b that constitute the second mixing stage current source 124 and turn ON one of, and turn OFF the other one of, two constant current sources 127a and 127b that constitutes the third mixing stage current source 127; and Mode 9: turn OFF both of two constant current sources 124a and 124b that constitute the second mixing stage current source 124 and turn ON both of two constant current sources 127a and 127b that constitutes the third mixing stage current source 127.

Note that, however, the fourth mode is equivalent to the first mode, the seventh mode is equivalent to the third mode, and the ninth mode is equivalent to the sixth mode. Accordingly, the second mixing ratio setting circuit 14D actually selects one of six modes. The other mixing circuit 13D included in the fourth exemplary differential output buffer 100D shown in FIG. 5 also includes a mixing ratio setting circuit having the same function.

TABLE 4 is a list of emphasis that the fourth exemplary differential output buffer 100D can realize.

TABLE 4

| VIN | | EV | | EV2 | |
|---|---|---|---|---|---|
| 1st + 2nd + 3rd | % | 2nd + 3rd | % | 2nd + 3rd | % |
| 60 + 30 + 10 | 100 | 0 + 0 | 0 | 0 + 0 | 0 |
| 60 + 30 + 5 | 95 | 0 + 5 | 5 | 0 + 0 | 0 |
| 60 + 30 + 5 | 95 | 0 + 0 | 0 | 0 + 5 | 5 |
| 60 + 30 + 0 | 90 | 0 + 10 | 10 | 0 + 0 | 0 |
| 60 + 30 + 0 | 90 | 0 + 5 | 5 | 0 + 5 | 5 |
| 60 + 30 + 0 | 90 | 0 + 0 | 0 | 0 + 10 | 10 |
| 60 + 15 + 10 | 85 | 15 + 0 | 15 | 0 + 0 | 0 |
| 60 + 15 + 10 | 85 | 0 + 0 | 0 | 15 + 0 | 15 |
| 60 + 15 + 5 | 80 | 15 + 5 | 20 | 0 + 0 | 0 |
| 60 + 15 + 5 | 80 | 15 + 0 | 15 | 0 + 5 | 5 |
| 60 + 15 + 5 | 80 | 0 + 5 | 5 | 15 + 0 | 15 |
| 60 + 15 + 5 | 80 | 0 + 0 | 0 | 15 + 5 | 20 |
| 60 + 15 + 0 | 75 | 15 + 10 | 25 | 0 + 0 | 0 |
| 60 + 15 + 0 | 75 | 15 + 5 | 20 | 0 + 5 | 5 |
| 60 + 15 + 0 | 75 | 15 + 0 | 15 | 0 + 10 | 10 |
| 60 + 15 + 0 | 75 | 0 + 10 | 10 | 15 + 0 | 15 |
| 60 + 15 + 0 | 75 | 0 + 5 | 5 | 15 + 5 | 20 |

TABLE 4-continued

| VIN | | EV | | EV2 | |
|---|---|---|---|---|---|
| 1st + 2nd + 3rd | % | 2nd + 3rd | % | 2nd + 3rd | % |
| 60 + 15 + 0 | 75 | 0 + 0 | 0 | 15 + 10 | 25 |
| 60 + 0 + 10 | 70 | 30 + 0 | 30 | 0 + 0 | 0 |
| 60 + 0 + 10 | 70 | 15 + 0 | 15 | 15 + 0 | 15 |
| 60 + 0 + 10 | 70 | 0 + 0 | 0 | 30 + 0 | 30 |
| 60 + 0 + 5 | 65 | 30 + 5 | 35 | 0 + 0 | 0 |
| 60 + 0 + 5 | 65 | 30 + 0 | 30 | 0 + 5 | 5 |
| 60 + 0 + 5 | 65 | 15 + 5 | 20 | 15 + 0 | 15 |
| 60 + 0 + 5 | 65 | 15 + 0 | 15 | 15 + 5 | 20 |
| 60 + 0 + 5 | 65 | 0 + 5 | 5 | 30 + 0 | 30 |
| 60 + 0 + 5 | 65 | 0 + 0 | 0 | 30 + 5 | 35 |
| 60 + 0 + 0 | 60 | 30 + 10 | 40 | 0 + 0 | 0 |
| 60 + 0 + 0 | 60 | 30 + 5 | 35 | 0 + 5 | 5 |
| 60 + 0 + 0 | 60 | 30 + 0 | 30 | 0 + 10 | 10 |
| 60 + 0 + 0 | 60 | 15 + 10 | 25 | 15 + 0 | 15 |
| 60 + 0 + 0 | 60 | 15 + 5 | 20 | 15 + 5 | 20 |
| 60 + 0 + 0 | 60 | 15 + 0 | 15 | 15 + 10 | 25 |
| 60 + 0 + 0 | 60 | 0 + 10 | 10 | 30 + 0 | 30 |
| 60 + 0 + 0 | 60 | 0 + 5 | 5 | 30 + 5 | 35 |
| 60 + 0 + 0 | 60 | 0 + 0 | 0 | 30 + 10 | 40 |

As shown in TABLE 4, the fourth exemplary differential output buffer 100D shown in FIG. 4 can continue the emphasis during a period of two taps with varying levels. Further, a combination of dimensions of the transistors in the first, second, and third output stage differential pairs 21, 22 and 26 enables to realize required emphasis levels shown in TABLE 4 by setting the mixing ratio in each of the mixing circuits 12D and 13D to 1:0:0, 1:1:0, 1:0:1, 0:1:0, 0:0:1, and 0:1:1. In addition, a total dimension of the transistors in the first, second and third output stage differential pairs 21, 22 and 26 is capable of transmitting output signals through a transmission line.

Accordingly, the third exemplary differential output buffer 100D is designed such that i) a sum of dimensions of the transistors in the first, second, and third output stage differential pairs 21, 22, and 26 is capable of transmitting output signals through a transmission line, and ii) a combination of dimensions of the transistors in the first, second, and third output stage differential pairs 21, 22, and 26 enables to realize required emphasis levels by setting the mixing ratio in each of the mixing circuits 12D and 13D to 1:0:0, 1:1:0, 1:0:1, 0:1:0, 0:0:1, and 0:1:1.

It is also possible to provide differential output buffers that can continue the emphasis during periods of three or more taps.

What is claimed is:

1. A differential output buffer, comprising:
  a mixing stage including a mixing circuit that adjusts first and second mixing stage current sources to mix a differential data signal and an inverted delayed differential data signal, which is the differential data signal delayed by a delay period and inverted, to generate a mixed differential data signal;
  an output stage including a first and a second output stage current source and a first and a second output stage differential pair of transistors, sources of the transistors in each of the output stage differential pairs being commonly coupled and supplied with an output stage operating current from corresponding one of the output stage current sources, gates of the transistors in the first output stage differential pair being supplied with the differential data signal and gates of the transistors in the second output stage differential pair being supplied with the mixed differential data signal, and drains of corresponding ones of the transistors in the first and second output stage differential pairs being commonly connected to form output nodes from which an emphasized differential data signal is output; and
  a mixing ratio setting circuit, included in the mixing stage, that sets a mixing ratio between the differential data signal and the inverted delayed differential data signal to one of 1:0, 1:1, and 0:1 based on a control signal,
  wherein:
  the mixing circuit includes a first mixing circuit that generates a first mixed differential data signal by mixing the differential data signal and the inverted delayed differential data signal with a first mixing ratio and a second mixing circuit that generates a second mixed differential data signal by mixing the differential data signal and the inverted delayed differential data signal with a second mixing ratio;
  the second output stage current source includes a first and a second emphasizing current t source:
  the second output stage differential pair includes a first and a second emphasizing differential pair of transistors, sources of the transistors in each of the emphasizing differential pairs are commonly coupled and supplied with an emphasizing current from corresponding one of the emphasizing current sources, the emphasizing currents supplied from the first and second emphasizing current sources are different with each other, and gates of the transistors in the first emphasizing differential pair are supplied with the first mixed differential data signal and gates of the transistors in the second emphasizing differential pair are supplied with the second mixed differential data signal; and
  the mixing ratio setting circuit sets each of the first and second mixing ratios to one of 1:0, 1:1, and 0:1.

2. The differential output buffer according to claim 1, wherein:
  the mixing circuit includes the first and the second mixing stage current source and a first and a second mixing stage differential pair of transistors, sources of the transistors in each of the mixing stage pairs are commonly coupled and supplied with a mixing stage operating current from corresponding one of the mixing stage current sources, gates of the transistors in the first mixing stage differential pair are supplied with the differential data signal and gates of the transistors in the second mixing stage differential pair are supplied with the inverted delayed differential data signal, and drains of corresponding ones of the transistors in the first and second mixing stage differential pairs are commonly connected to respective mixing stage load resistors to form mixing stage output nodes from which the mixed differential data signal is output,
  wherein the mixing ratio setting circuit sets the mixing ratio by one of:
  (1) enabling or disabling to supply the mixing stage operating current to each of the first and second mixing stage differential pairs; and
  (2) enabling or disabling to supply one of the differential data signal and the inverted delayed differential data signal to the gates of the transistors in each of the first and second mixing stage differential pairs.

3. The differential output buffer according to claim 2, wherein:
  each of the first and second mixing stage current sources supplies a first mixing stage operating current and a second mixing stage operating current, which is twice the first mixing stage operating current; and the mixing ratio setting circuit sets the mixing ratio to:
(1) 1:1 by enabling each of the first and second mixing stage current sources to supply the first mixing stage operating current to corresponding one of the first and second mixing stage differential pairs; and
(2) one of 1:0 and 0:1 by enabling one of, and disabling the other of, the first and second mixing stage current sources to supply the second mixing stage operating current to corresponding one of the first and second mixing stage differential pairs.

4. The differential output buffer according to claim 1, wherein:
the inverted delayed differential data signal includes an inverted first-tap delayed differential data signal, which is the differential data signal delayed by a first delay period and inverted, and an inverted second-tap delayed differential signal, which is the differential data signal delayed by a second delay period, different from the first delay period, and inverted;
each of the first and second mixing circuits generates corresponding one of the first and second mixed differential data signals by mixing the differential data signal, the inverted first-tap delayed differential data signal, and the inverted second-tap delayed differential data signal; and
the mixing ratio setting circuit sets a mixing ratio between the differential data signal, the inverted first-tap delayed differential data signal, and the inverted second-tap delayed differential data signal of each of the first and second mixing circuits to one of 1:0:0, 1:1:0, 1:0:1, 0:1:0, 0:0:1, and 0:1:1.

5. A method of controlling an emphasis level of an emphasized differential data signal, the method comprising:
providing an output stage including a first and a second output stage current source and a first and a second output stage differential pair of transistors, sources of the transistors in each of the output stage differential pairs being commonly coupled and supplied with an output stage operating current from corresponding one of the output stage current sources, and drains of corresponding ones of the transistors in the first and second output stage differential pairs being commonly connected to form output nodes;
mixing, in a mixing stage, a differential data signal and an inverted delayed differential data signal, which is the differential data signal delayed by a delay period and inverted, with a mixing ratio set by setting currents of first and second mixing stage current sources to generate a mixed differential data signal;
inputting the differential data signal to gates of the transistors in the first output stage differential pair and the mixed differential data signal to gates of the transistors in the second output stage differential pair;
outputting the emphasized differential data signal from the output nodes; and
controlling the emphasis level of the emphasized differential data signal by setting, with a mixing ration setting circuit, the mixing ratio to one of 1:0, 1:1, and 0:1 in response to a control signal,
wherein:
the second output stage current source includes a first and a second emphasizing current source;
the second output stage differential pair includes a first and a second emphasizing differential pair of transistors, sources of the transistors in each of the emphasizing differential pairs are commonly coupled and supplied with an emphasizing current from corresponding one of the emphasizing current sources, the emphasizing currents supplied from the first and second emphasizing current sources are different with each other;
the mixing includes mixing the differential data signal and the inverted delayed differential data signal with a first mixing ratio to generate a first mixed differential data signal and mixing the differential data signal and the inverted delayed differential data signal with a second mixing ratio to generate second mixed differential data signal;
the inputting includes inputting the first mixed differential data signal to gates of the transistors in the first emphasizing differential pair and the second mixed differential data signal to gates of the transistors in the second emphasizing differential pair; and
the controlling controls the emphasis level by setting each of the first and second mixing circuits to one of 1:0, 1:1, and 0:1.

6. The method according to claim 5, wherein:
the inverted delayed differential data signal includes an inverted first-tap delayed differential data signal, which is the differential data signal delayed by a first delay period and inverted, and an inverted second-tap delayed differential signal, which is the differential data signal delayed by a second delay period, different from the first delay period, and inverted;
the mixing generates each of the first and second mixed differential data signals by mixing the differential data signal, the inverted first-tap delayed differential data signal, and the inverted second-tap delayed differential data signal; and
the controlling controls the emphasis level by setting a mixing ratio between the differential data signal, the inverted first-tap delayed differential data signal, and the inverted second-tap delayed differential data signal for each of the first and second mixed differential data signals to one of 1:0:0, 1:1:0, 1:0:1, 0:1:0, 0:0:1, and 0:1:1.

7. A method of designing a differential output buffer, the method comprising:
designing a mixing stage including a mixing circuit that mixes a differential data signal and an inverted delayed differential data signal, which is the differential data signal delayed by a delay period and inverted, with a mixing ratio set by setting currents of first and second mixing stage current sources to generate a mixed differential data signal; and
designing an output stage including a first and a second output stage current source and a first and a second output stage differential pair of transistors, sources of the transistors in each of the output stage differential pairs being commonly coupled and supplied with an output stage operating current from corresponding one of the output stage current sources, gates of the transistors in the first output stage differential pair being supplied with the differential data signal and gates of the transistors in the second output stage differential pair being supplied with the mixed differential data signal, and drains of corresponding ones of the transistors in the first and second output stage differential pairs being commonly connected to form output nodes from which an emphasized differential data signal is output,
wherein the designing of the output stage includes determining dimensions of the transistors in the first and second output stage differential pairs such that:
(1) a sum of the dimensions of the transistors in the first and second output stage differential pairs is capable of transmitting the emphasized differential data signal through a transmission line; and (2) a combination of the dimensions of the transistors in the first and second output stage differential pairs enables to realize required emphasis levels of the emphasized differential data signal by setting the mixing ratio to 1:0, 1:1, and 0:1 with a mixing ratio setting circuit and in response to a control signal, and wherein:

the designing of the mixing stage is performed such that the mixing circuit includes a first mixing circuit that generates a first mixed differential data signal by mixing the differential data signal and the inverted delayed differential data signal with a first mixing ratio and a second mixing circuit that generates a second mixed differential data signal by mixing the differential data signal and the inverted delayed differential data signal with a second mixing ratio;

the designing of the output stage is performed such that:

the second output stage current source includes a first and a second emphasizing current source; and the second output stage differential pair includes a first and a second emphasizing differential pair of transistors, sources of the transistors in each of the emphasizing differential pairs are commonly coupled and supplied with an emphasizing current from corresponding one of the emphasizing current sources, the emphasizing currents supplied from the first and second emphasizing current sources are different with each other, and gates of the transistors in the first emphasizing differential pair are supplied with the first mixed differential data signal and gates of the transistors in the second emphasizing differential pair are supplied with the second mixed differential data signal; and the determining determines the dimension of the transistors in the first output stage differential pair and dimensions of transistors in the first and second emphasizing differential pairs such that:

(1) a sum of the dimension of the transistors in the first output stage differential pair and the first and second emphasizing differential pairs is capable of transmitting the emphasized differential data signal through the transmission line; and (2) a combination of the dimensions of the transistors in the first output stage differential pair and the first and second emphasizing differential pairs enables to realize the required emphasis levels of the emphasized differential data signal by setting each of the first and second mixing ratios to one of 1:0, 1:1, and 0:1.

\* \* \* \* \*